(12) United States Patent
Guilhamat et al.

(10) Patent No.: US 7,098,657 B2
(45) Date of Patent: Aug. 29, 2006

(54) METHOD OF STABILISING A MAGNETOMETER SIGNAL, AND STABILISED MAGNETOMETERS

(75) Inventors: Bernard Guilhamat, Saint Michel de Saint Geoirs (FR); Jean-Michel Leger, Villard-Bonnot (FR)

(73) Assignee: Commissariat a l'Energie Atomique, Paris (FR)

( * ) Notice: Subject to any disclaimer, the term of this patent is extended or adjusted under 35 U.S.C. 154(b) by 22 days.

(21) Appl. No.: 10/485,034

(22) PCT Filed: Aug. 13, 2002

(86) PCT No.: PCT/FR02/02869

§ 371 (c)(1),
(2), (4) Date: Jan. 26, 2004

(87) PCT Pub. No.: WO03/016933

PCT Pub. Date: Feb. 27, 2003

(65) Prior Publication Data

US 2004/0201379 A1    Oct. 14, 2004

(30) Foreign Application Priority Data

Aug. 16, 2001 (FR) .................................. 01 10853

(51) Int. Cl.
*G01R 33/04* (2006.01)
*G01R 35/00* (2006.01)

(52) U.S. Cl. ...................... 324/253; 324/225

(58) Field of Classification Search ............... 324/338, 324/339, 342, 343, 253–255, 244, 225, 202, 324/247, 258, 260
See application file for complete search history.

(56) References Cited

U.S. PATENT DOCUMENTS

| | | | | |
|---|---|---|---|---|
| 3,557,777 A | * | 1/1971 | Cohen | 600/409 |
| 3,701,007 A | * | 10/1972 | Schad | 324/247 |
| 4,272,724 A | * | 6/1981 | Wada et al. | 324/253 |
| 4,995,165 A | | 2/1991 | Daniels | |
| 5,652,512 A | * | 7/1997 | Feintuch et al. | 324/254 |
| 5,939,881 A | * | 8/1999 | Slater et al. | 324/253 |
| 6,037,769 A | * | 3/2000 | Hoon et al. | 324/228 |
| 6,268,725 B1 | * | 7/2001 | Vernon et al. | 324/253 |
| 6,538,437 B1 | * | 3/2003 | Spitzer et al. | 324/252 |
| 6,586,939 B1 | * | 7/2003 | Fanini et al. | 324/339 |

FOREIGN PATENT DOCUMENTS

EP    1 039 307 A1    9/2000

OTHER PUBLICATIONS

Digital Detection and Feedback Fluxgate Magnetometer☐☐Meas. Sci. Technol., 7 (1996) pp. 897-903☐☐J Piil-Henriksen, J M G Merayo, O V Nielsen, H Petersen, J Raagaard Peterson, F Primdahl.*

(Continued)

*Primary Examiner*—Jay M. Patidar
(74) *Attorney, Agent, or Firm*—Pearne & Gordon LLP

(57) ABSTRACT

The magnetometer includes a magnetic core (1) with at least one branch (2, 3), at least one exciting coil (4, 5) and one take-up coil (10) sensitive to ambient fields thanks to the excitation field (B). An additional magnetic field, to advantage perpendicular to the previous ones, is added to eliminate very low frequency noises, without it being measured.

14 Claims, 3 Drawing Sheets

OTHER PUBLICATIONS

Race-track Fluxgate With Adjustable Feedthrough☐☐Sensors and Actuators, 85 (2000) oages 227-231☐☐Pavel Ripka.*

A Micro-fluxgate Magnetic Sensor Using Micromachined Planar Solenoid Coils☐☐Sensors and Actuators, 77 (1999) pp. 66-72☐☐Trifon M. Liakopoulos, Chong H. Ahn.*

J Piil-Henriksen, J.M.G. Merayo, O. V. Nielsen, H. Petersen, J. Raggaard Petersen and F. Primdahl, "Digital Detection and Feedback Fluxgate Magnetometer", 1996 IOP Publishing Ltd, pp. 897-903.

Trifon M. Liakopoulos and Chong H. Ahn, "A Micro-Fluxgate Magnetic Sensor Using Micromachined Planar Solenoid Coils", 1999 Elsevier Science S. A., 7 pages.

Pavel Ripka, "Race-Track Fluxgate with Adjustable Feedthrough", 2000 Elsevier Science S. A., 5 pages.

* cited by examiner

METHOD OF STABILISING A MAGNETOMETER SIGNAL, AND STABILISED MAGNETOMETERS

The subject of this invention is a method of stabilising a magnetometer signal and magnetometers so stabilised.

Magnetometers of the "fluxgate" type considered here include a magnetic core, at least one active coil wound around the core, through which an excitation current passes creating a magnetic field in the core, and a take-up coil with two windings in series, it too being wound around the core and fitted with means for measuring the voltage at its terminals. Most often, the core is a core including two branches connected in series, the windings of the take-up coil are placed around the branches respectively, and two active coils are found each of which includes two windings placed around the branches respectively. The active coils are then wound in the same way around each of the branches but the opposite way from one branch to the other, in such a way that their effects are strengthened and generate a magnetic field of circulation in the core; but the take-up coil is wound in such a way that the magnetic field produced by the active coils induces counter currents in its two windings, and which cancel each other out.

Magnetometers so constructed have the particularity of being insensitive to the first degree to the magnetic field produced by the exciting current, but of being sensitive to ambient magnetic fields, which interact with the excitation magnetic field, if the latter is of sufficient intensity: an induced current, with a frequency double that of the excitation current and with an intensity proportionate to that of the ambient magnetic field, passes through the take-up coil of the magnetometer and can be measured.

Other, less sophisticated, magnetometers do not include differentially connected windings in series of the take-up coil and measure an induced current including the excitation frequency and the double frequency; the invention may also be applied to them.

The inventors have however noted that these magnetometers were subject to not insignificant low-frequency noises, which were able to jam or block out the induced signal representing the magnetic field to be measured. They have therefore sought to stabilise the total output signal by reducing this noise. The solution they propose here consists in subjecting the take-up coil to an additional alternating magnetic field, to which the measurement means are insensitive.

This additional magnetic field may have any direction, and can be produced by the active coil in addition to the magnetic sensitisation field or by another means.

The invention will now be described with reference to the figures.

Figure 1:
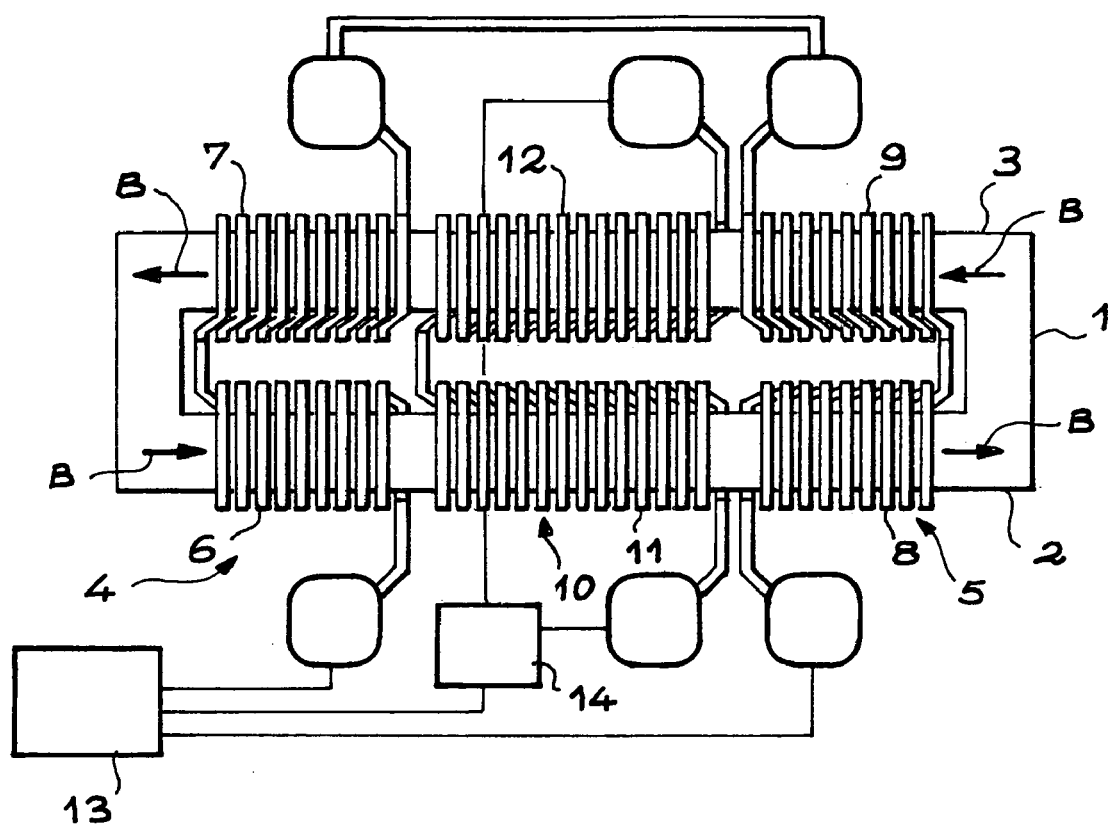
FIG. 1 is a general view of the magnetometer.

The differential magnetometer in FIG. 1 is the most common type and includes a magnetic core 1 rectangular in shape with two main branches 2 and 3 in series. Three coils are wound around the core 1, and more exactly two active coils 4 and 5 each including two windings 6, 7 and 8, 9 around the branches 2 and 3 respectively, and a take-up coil 10 composed of two winding 11 and 12 also around the branches 2 and 3 respectively. The active coils 4 and 5 are connected in series in a circuit leading to an excitation device 13, and the take-up coil is at the terminals of a measurement device 14.

The windings 6 and 8 are formed in the same direction around the branch 2, and the windings 7 and 9 in an opposite direction around the other branch 3 in such a way as to create a magnetic field B able to circulate in the magnetic core when it is closed, as is the core 1.

When the magnetic circuit is open, a magnetic field circulates in each of the branches and these two magnetic fields are counter-directional.

The windings 11 and 12 of the take-up coil 10 are in the same direction, whereas the windings 6 and 8 have directions counter to the windings 7 and 9.

The excitation means are able to supply an excitation current at a pre-set frequency and may include an oscillator, a binary frequency divider, a square wave to triangular wave converter and a voltage to current converter. The measurement means 14 include a preamplifier collecting the voltage at the terminals of the take-up coil 10, a synchronous detector supplied by the signal of the oscillator not divided by two, a low-pass filter, a proportional-integral-differential corrector, an amplifier, a low-pass filter associated with the display means and to allow persistence of vision at cut-off frequency of about one hertz, and display means. A feedback current may be applied at the terminals of the measurement coil 10 by sampling the voltage at the correction module output and converting it into current. No more time will be spent on these elements, which have already been disclosed and are moreover quite straightforward, and which allow the induced signal to be sampled at a frequency double the excitation frequency and allow it to be converted into a continuous signal prior to transmitting it to the display means, which measure it.

Figure 2:
FIG. 2 shows a noise obtained without the invention being implemented.

FIG. 2 shows that the void signal obtained with a magnetometer of this type includes oscillations of an amplitude able to reach about 2 microteslas in this example, essentially between two extreme values, with no pronounced periodicity but concentrated at the very low frequencies. The sample shown covers a time of 30 seconds. As the amplitude of the signal to be measured is often barely greater than this noise, it can be imagined that measurement is very muddled and that an improvement is called for.

According to the invention, an additional magnetic field is applied in order to stabilise the measurement. It may be of 350 microteslas for a frequency of 60 kHz when the field produced by the excitation frequency is 0.9 tesla. No other particular requirements have been noted in order to obtain an appreciable reduction in very low frequency noise, with the result that the additional stabilisation field is able to be produced in different ways and have different directions.

It may be convenient to produce it via an element built into the magnetometer, using already existing means such as the exciting coils 4 and 5: the excitation means 13 will then be designed so as to produce the two excitation and stabilisation fields, at different frequencies and simultaneously.

Figure 4:
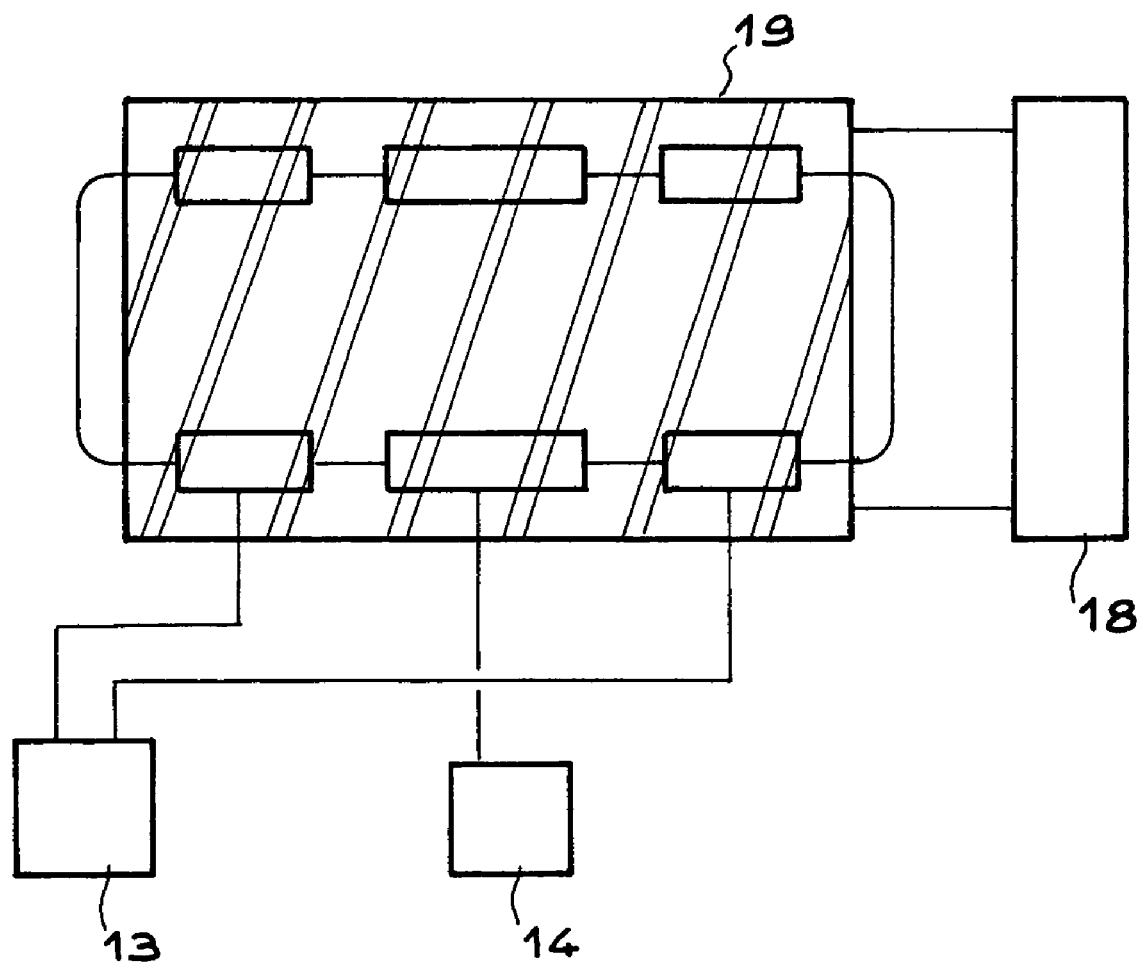
FIGS. 4, 5 and 6 shows three embodiments of the invention.

In another embodiment of the invention, shown in FIG. 4, an additional coil 19 is placed around the magnetometer, the two branches 2 and 3 and all the other coils previously encountered, and additional excitation means 18 are placed at its ends so as to produce the additional field.

However if the stabilisation field is parallel to the measurement field, a drawback is encountered in that the stabilisation field may dazzle or saturate the measurement means due to the overlapping of the frequency bands.

Figure 3:
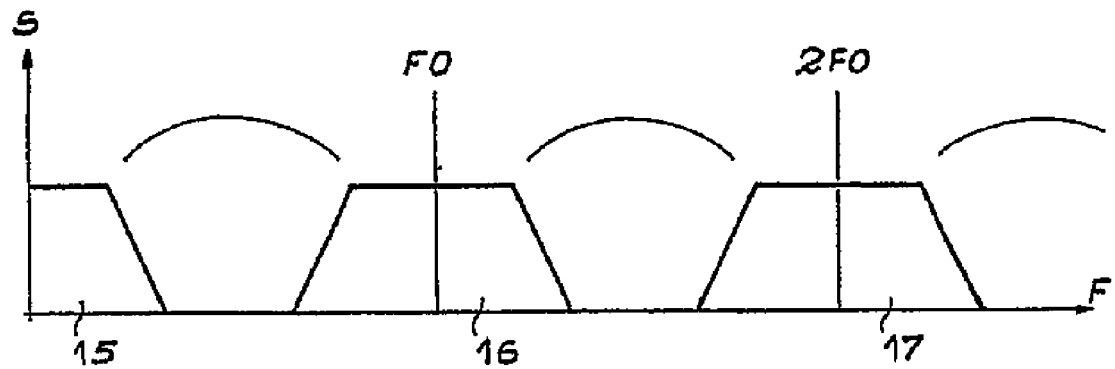
FIG. 3 is a frequency diagram.
Figure 4:
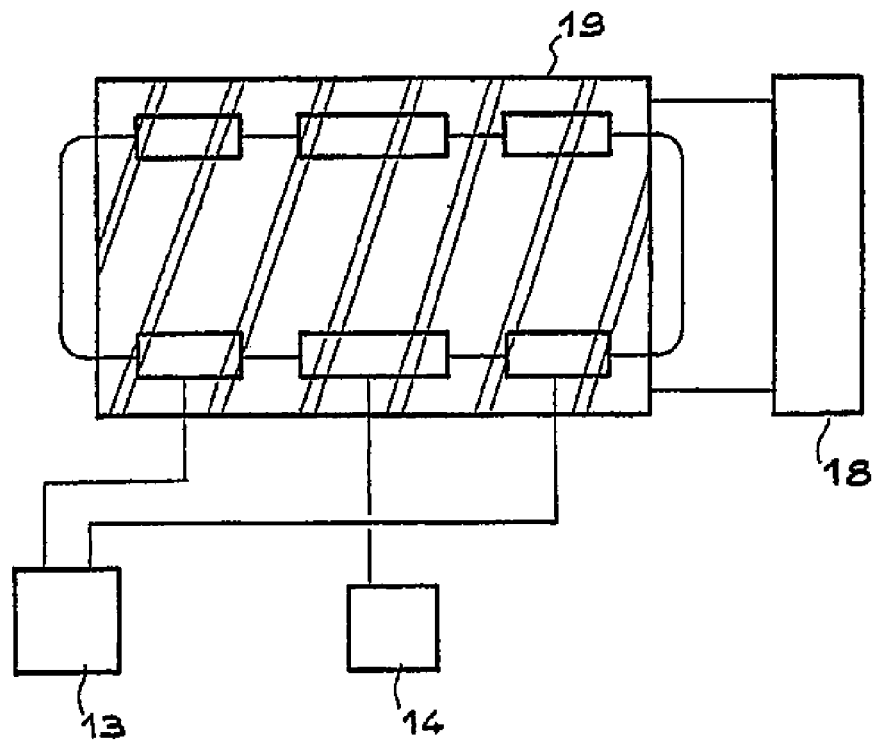

Referring to FIG. 3, which is a frequency diagram, the reference 15 has been given to the pass band of the ambient signal able then to be detected, the reference 16 to the excitation pass band and the reference 17 to the measurement pass band, in which the induced signal is collected. These bands 15, 16 and 17 are roughly equidistant, the band 15 bringing together the low frequencies and the band 17 being at frequencies double the band 16.

Figure 5:
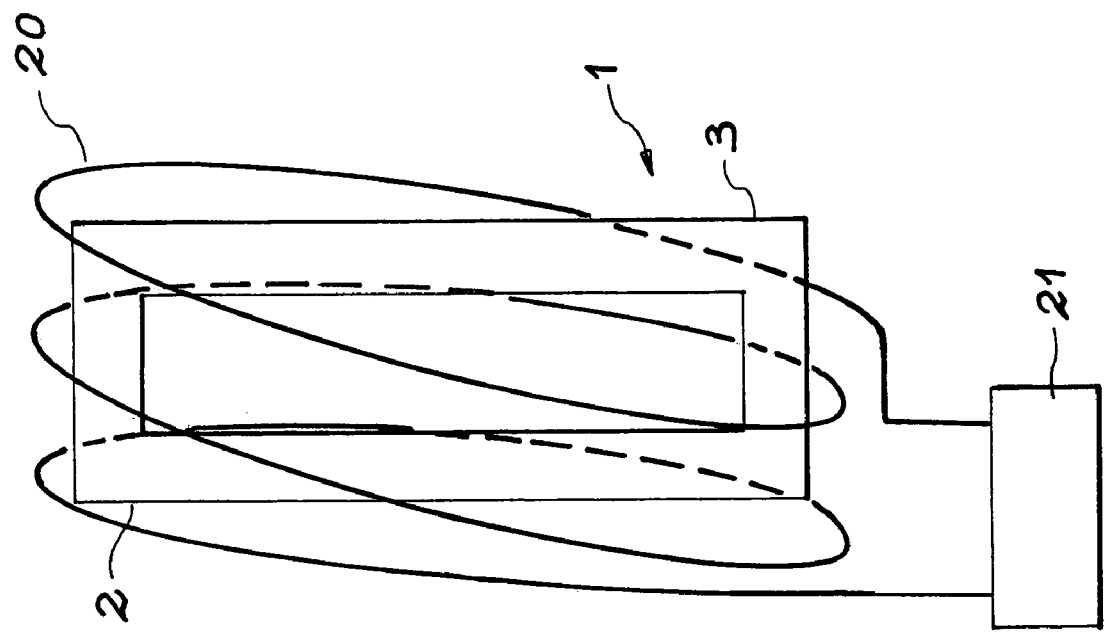

It is therefore recommended, if a special means is added to create the additional field, that it is placed such that this field is perpendicular to the excitation field. FIG. 5 shows an arrangement of this kind: an additional coil 20, supplied by additional excitation means 21 at its ends, is orientated in such a way that its axis cuts the branches 2 and 3 of the core 1, contrary to the arrangement in FIG. 4.

Figure 6:
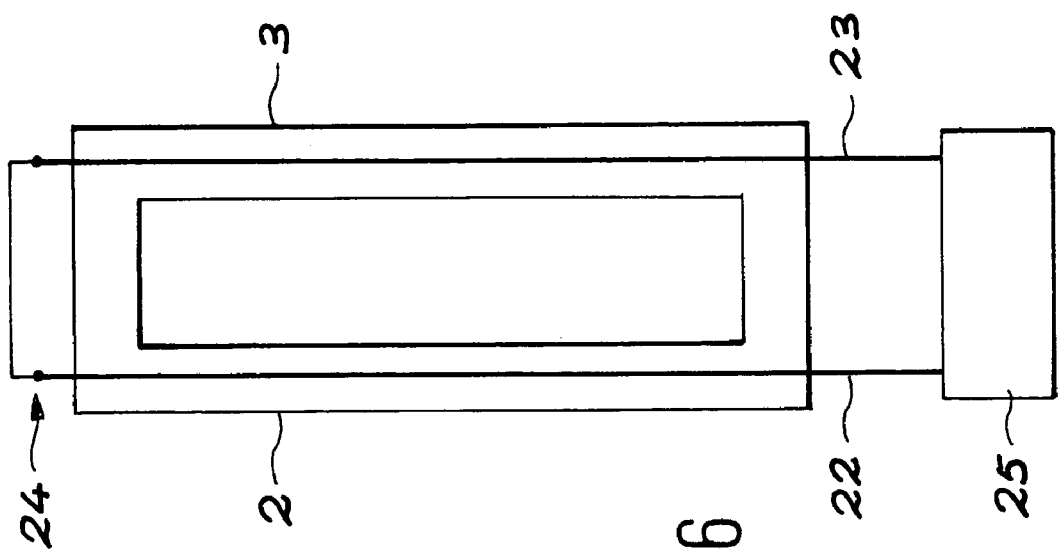

Instead of an additional single coil like 19 or 20, several additional coils could be used, which would be orientated in such a way as to create an additional field resulting in the chosen direction. Instead of coils, a conductor wire passed through by a current is sufficient to create the additional field. A particular embodiment appears in FIG. 6, where two wires 22 and 23 are used, close to the branches 2 and 3 respectively, and parallel to them such that the additional field, perpendicular to the wires 22 and 23, is so also to the excitation field B. In-phase or out-of-phase currents can pass through the wires 22 and 23; it is therefore possible to unite them in a single circuit 24 provided with a common excitation means 25.

The frequency of the additional stabilisation field will to advantage be lower than the frequency of the band 16 (of the excitation current). However, it may be any size if the additional field is perpendicular to the excitation field or if it has been possible to eliminate completely the signals induced at the excitation frequency in the coil, via a rigorously symmetrical construction of the branches of the magnetometer or by a compensation device; the frequency of the additional stabilisation field may even be in the measurement band 17.

But if the additional field is parallel to the excitation field (and to the direction of the ambient field to which the magnetometer is sensitive), it will be appropriate to take additional precautions and to choose the frequency of this additional field outside the detection band 15 the excitation band 16 and the measurement band 17.

If the magnetometer is not differentially connected, it will be preferable to choose one of the embodiments with the additional magnetic field perpendicular to the excitation field and to the take-up coil.

The invention claimed is:

1. method for stabilizing a magnetometer, the magnetometer including a magnetic core (1), coils including at least one active coil (4, 5) and one take up coil (10), the active coil being arranged to create a magnetic excitation field (B) in the core which sensitizes the take-up coil, means (13) for passing an alternating current at an excitation frequency in the active coil and means (14) for measuring a voltage induced at a frequency double the excitation frequency in the take-up coil, said method consisting in subjecting the take-up coil to an additional alternating magnetic field, to which the measurement means (14) are insensitive.

2. A method according to claim 1, wherein the additional magnetic field is produced by the active coil.

3. A method according to claim 1, wherein the additional magnetic field is perpendicular to the take-up coil and to the excitation field.

4. A method according to claim 1, wherein the additional magnetic field has a frequency outside an excitation band (16), a measurement band (17) and a detection band (15).

5. A magnetometer including a magnetic core (1), coils including at least one active coil (4, 5) and one take-up coil (10), the active coil being arranged to create a magnetic excitation field (B) in the core which sensitizes the take-up coil, means (13) for passing an alternating current at an excitation frequency in the active coil and means (14) for measuring a voltage induced at a frequency double the excitation frequency in the take-up coil, including a coil (19, 20) surrounding the magnetic core (1) so as to produce an additional magnetic field, to which the measurement means (14) are insensitive.

6. A magnetometer including a magnetic core (1), coils including at least one active coil (4, 5) and one take-up coil (10), the active coil being arranged to create a magnetic excitation field (B) in the core which sensitizes the take-up coil, means (13) for passing an alternating current at an excitation frequency in the active coil and means (14) for measuring a voltage induced at a frequency double the excitation frequency in the take-up coil, including at least one conductor wire (22, 23) passed through by a current so as to produce an additional magnetic field, to which the measurement means (14) are insensitive.

7. A magnetometer according to claim 6, including as many conductor wires as the core (1) includes branches (2, 3), the wires being respectively close to the branches and parallel to the branches.

8. A method for stabilizing a magnetometer, the magnetometer including a magnetic core (1), coils including at least one active coil (4, 5) and one take-up coil (10), the active coil being arranged to create a magnetic excitation field (B) in the core which sensitizes the take-up coil, means (13) for passing an alternating current at an excitation frequency in the active coil and means (14) for measuring a voltage induced at a frequency double the excitation frequency in the take-up coil, said method consisting in subjecting the take-up coil to an additional alternating magnetic field, to which the measurement means (14) are insensitive so that said induced voltage is unaltered while a low-frequency noise in the take-up coil is eliminated.

9. A method according to claim 8, wherein the additional magnetic field is produced by the active coil.

10. A method according to claim 8, wherein the additional magnetic field is perpendicular to the take-up coil and to the excitation field.

11. A method according to claim 8, wherein the additional magnetic field has a frequency outside an excitation band (16), a measurement band (17) and a detection band (15).

12. A magnetometer including a magnetic core (1), coils including at least one active coil (4, 5) and one take-up coil (10), the active coil being arranged to create a magnetic excitation field (B) in the core which sensitizes the take-up coil, means (13) for passing an alternating current at an excitation frequency in the active coil and means (14) for measuring a voltage induced at a frequency double the excitation frequency in the take-up coil, including a coil (19, 20) surrounding the magnetic core (1) so as to produce an additional magnetic field to which the measurement means (14) are insensitive so that said induced voltage is unaltered while a low-frequency noise in the take-up coil is eliminated.

13. A magnetometer including a magnetic core (1), coils including at least one active coil (4, 5) and one take-up coil (10), the active coil being arranged to create a magnetic excitation field (B) in the core which sensitizes the take-up coil, means (13) for passing an alternating current at an excitation frequency in the active coil and means (14) for measuring a voltage induced at a frequency double the excitation frequency in the take-up coil including at least one conductor wire (22, 23) passed through by a current so as to produce an additional magnetic field, to which the measurement means (14) are insensitive so that said induced voltage is unaltered while a low-frequency noise in the take-up coil is eliminated.

14. A magnetometer according to claim 13, including as many conductor wires as the core (1) includes branches (2, 3), the wires being respectively close to the branches and parallel to the branches.

* * * * *

UNITED STATES PATENT AND TRADEMARK OFFICE
CERTIFICATE OF CORRECTION

PATENT NO. : 7,098,657 B2
APPLICATION NO. : 10/485034
DATED : August 29, 2006
INVENTOR(S) : Guilhamat et al.

It is certified that error appears in the above-identified patent and that said Letters Patent is hereby corrected as shown below:

In the Drawings, please delete sheet 2 of 3 and insert replacement sheet 2 of 3.

Signed and Sealed this

Twenty-sixth Day of December, 2006

JON W. DUDAS
*Director of the United States Patent and Trademark Office*